United States Patent [19]

Meline

[11] Patent Number: 5,047,735

[45] Date of Patent: Sep. 10, 1991

[54] RZ CLOCK RECOVERY CIRCUIT WITH POSITIVE-FEEDBACK

[75] Inventor: Reuben W. Meline, Crystal, Minn.

[73] Assignee: ADC Telecommunications, Inc., Minneapolis, Minn.

[21] Appl. No.: 593,692

[22] Filed: Oct. 5, 1990

[51] Int. Cl.⁵ .......................... H03B 5/12; H03L 7/24
[52] U.S. Cl. .............................. 331/117 R; 331/172; 307/269; 328/63; 375/110
[58] Field of Search .......... 331/117 R, 117 FE, 167, 331/172; 375/106, 110, 111, 118, 119; 307/269; 328/63

[56] References Cited

U.S. PATENT DOCUMENTS

| | | | |
|---|---|---|---|
| 4,222,117 | 9/1980 | Bugg | 375/110 |
| 4,918,406 | 4/1990 | Baumbach et al. | 331/172 X |
| 4,996,444 | 2/1991 | Thomas et al. | 375/118 X |

Primary Examiner—Siegfried H. Grimm
Attorney, Agent, or Firm—Merchant, Gould, Smith, Edell, Welter and Schmidt

[57] ABSTRACT

A clock recovery circuit includes a tuned-tank circuit for receiving RZ data signals, a comparator for converting an analog clock signal produced by the tuned-tank circuit to a digital clock signal, and a positive feedback of the digital clock signal to the tuned-tank circuit for self-regenerating the clock signal.

7 Claims, 1 Drawing Sheet

RZ CLOCK RECOVERY CIRCUIT WITH POSITIVE-FEEDBACK

TECHNICAL FIELD OF THE INVENTION

This invention relates generally to clock recovery circuits and more particularly to tuned-tank clock recovery circuits for RZ data.

BACKGROUND OF THE INVENTION

This invention relates to serial digital data streams consisting of so-called ones and zeroes. In the past, many methods have been used to extract clock signals from a serial data stream. Most of these methods require a given number of ones in a string of data, and a guaranteed ones density. In a tuned-tank system, the tank is excited by the ones in the data signal and allowed to free-run during the zeros. The output of this is usually converted to a digital clock signal using a comparator or some such device. The amplitude of the tank signal begins to decay exponentially during a long string of zeros. Eventually, the amplitude becomes so small that a coherent clock cannot be extracted.

The Q (Quality) of the tank determines how long the clock can be maintained during a string of zeros. The Q of the tank also determines how sharply tuned the tank is. For an incoming data stream, the clock rate must be limited to a range of frequencies in order for the tank to be excited by the data stream. So there is a trade-off between making the Q large enough to "bridge" over a predetermined string of zeros, and small enough to accommodate a given range of data clock rates. Also, as the amplitude of the tank circuit decays during a string of data zeros, the frequency of the tank signal wanders back to its resonant frequency from the input data clock rate. Since the recovered clock is usually used to clock in the data into a serial in, parallel out shift register, the phase of the clock becomes somewhat critical. As the frequency of the recovered clock wanders back to its resonant frequency, the phase of the clock with respect to the data changes.

Thus, a principal problem with tuned-tank clock recovery circuits is loss of clock recovery when a high number of zeros is received. The consequences of this occurrence are that the framing pattern embedded in the data may be lost, resulting in a large number of bit errors in the received data while the framer IC searches for the framing pattern. As a result, there is a need for a clock recovery circuit that is self-regenerative to avoid loss of clock yet is flexible enough to track an incoming data stream clock rate.

SUMMARY

The clock recovery circuit of the present invention includes a tuned parallel-resonant tank circuit excited by a common-base transistor. The transistor in turn is driven by a high-speed (HC) CMOS-family gate. Since this gate has a variable output impedance, the transistor can also be fed with a limited amount of output signal in parallel with the output of the HC CMOS gate. The effect is a positive feedback system that provides self-regeneration of the clock signal yet allows for flexible tracking.

DETAILED DESCRIPTION OF THE INVENTION

Figure 1:
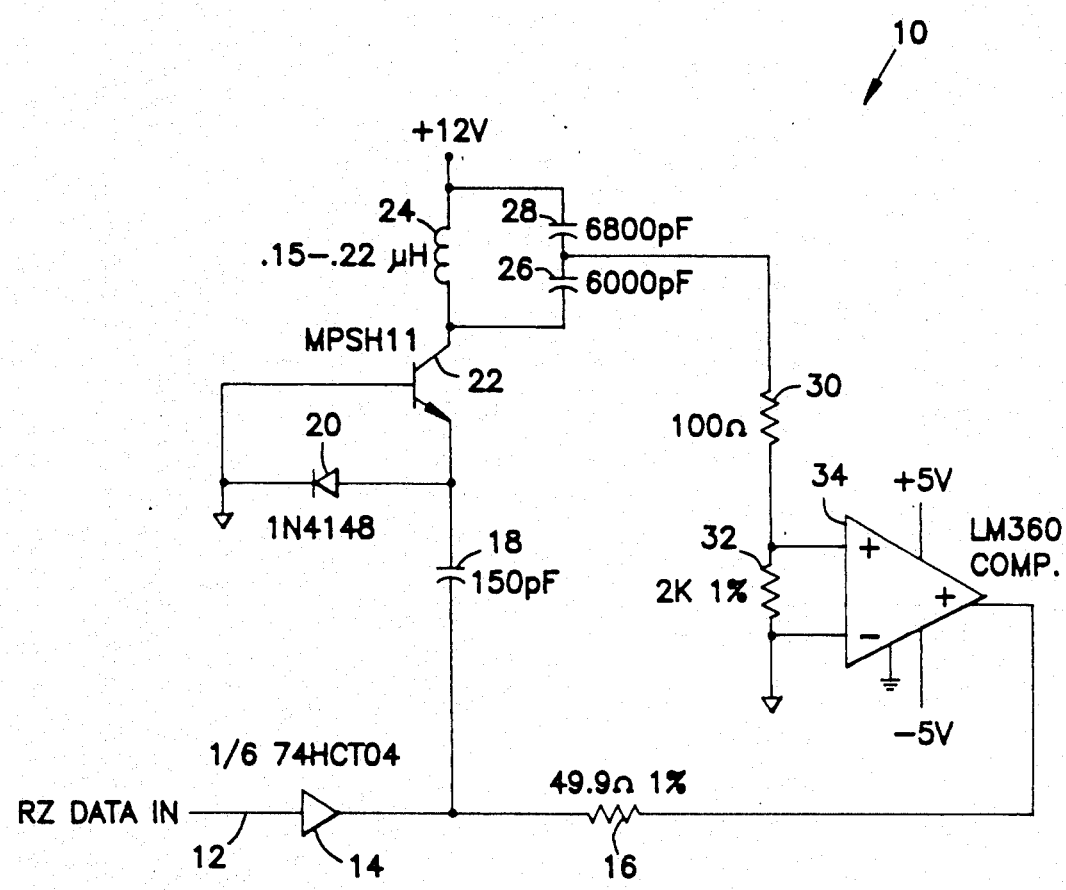
FIG. 1 is a schematic of the clock recovery circuit according to the present invention.

The clock recovery circuit 10 of the present invention is illustrated in FIG. 1. The non-inverted return-to-zero (RZ) data 12 connects to a 74HCT04 (high-speed CMOS) invertor 14 to buffer the signal. The output of the inverter 14 connects to a 49.9 ohm resistor 16 and to a 150 pf 100V ceramic capacitor 18. The other side of capacitor 18 connects to the anode of a 1N4148 diode 20 and the emitter of an MPSH11 NPN transistor 22. The base of the transistor and the cathode of the diode are both connected to receiver common. The diode 18 prevents the input signal excursions from going too far positive. The collector of the transistor connects to a 0.15 to 0.22 uH tuneable inductor 24, and a 6800 pf capacitor 26. The other end of the capacitor 26 connects to another capacitor 28 of the same value, and to a 100 ohm resistor 30. The other end of the capacitor 28 connects to +12V supply, as does the other end of the tuneable inductor 24. The other end of the 100 ohm resistor connects to a 2K resistor 32 and to the + input of an LM360 comparator 34. The 2K resistor 32 provides a DC path to receiver common to bias the LM360 input properly.

The RZ data at the 150 pf capacitor 18 enables the transistor to excite the tuned-tank circuit. This signal is "bled-off" via the 100 ohm resistor 30 into the LM360 34 where it is converted to a digital clock signal. The LM360 + output is also fed back into the transistor via the 49.9 ohm resistor 16. Since the output of the HC invertor integrated circuit 14 has a variable impedance, it will tolerate having its output driven by another integrated circuit and will not sustain any damage. The output of the LM360 integrated circuit 34 is a TTL compatible output, so it will easily drive a high-current active-low signal through a 49.9 ohm resistor into the output of the invertor gate 14 and the 150 pf capacitor connected to the transistor. This causes the clock recovery circuit to be regenerative, so it continues to oscillate even with no RZ data from the receiver.

The transistor 22 is connected as a common-base amplifier, so the current at the emitter will be equal to the sum of the base and collector currents. Since the base current is about one-one hundredth the value of the collector current, the emitter current is approximately the same as the collector current. So the transistor is a high-impedance current source.

The required values for the tuned-tank were determined using the resonant formula:

$$FR = 1/(2*pi*[L*C]^{\frac{1}{2}})$$

The Q of the tank is greater than 100. Since the 3 dB bandwidth of a tank circuit is determined by the Q of the tank circuit according to the formula:

$$bw = Fr/Q$$

Circuit 10 has a bandwidth of about 60 KHz when Fr is about 6MHz.

The number of zeros circuit 10 is able to tolerate in the data without losing the clock is strictly a function of the phase of the clock with respect to the data. Since the data is RZ data, there is half the time in the data to work with that is normally allowed with NRZ (non-return-to-zero) data. Since the clock needs to be somewhere near the middle of the data pulse (to "sample" the data), circuit 10 can only withstand about ¼ data period clock phase drift. This amount of drift is determined by the difference in frequency between the clock tank circuit and the data rate. Of course, the more zeros in the data, the farther away the clock edges will move from the center of the data period. Eventually, the clock edges will fall outside of the valid data period, causing erroneous data samples.

Although the invention has been described in its preferred form, those of skill in the art will recognize that many equivalent designs are possible, without departing from the scope of the claims appended hereto.

What is Claimed is:

1. A tuned-tank clock recovery circuit for RZ data comprising:
   tuned-tank oscillator means, including input means, for receiving an RZ data input stream, recovering the RZ clock signal, and providing a digital clock signal output; and
   said oscillator means including positive feedback means for feeding the recovered clock signal back to its input means to provide a self-regenerating clock recover circuit.

2. The circuit of claim 1 further wherein the input of the oscillator means includes a high speed CMOS integrated circuit buffer and wherein the recovered clock signal is fed back into a circuit node at the output of said buffer.

3. The circuit of claim 2 further, wherein the recovered clock signal is fed back using said clock signal output.

4. A tuned-tank clock recovery circuit for RZ data comprising:
   a tuned-tank oscillator having an input for RZ data and an analog clock signal output;
   means for converting the analog clock signal output of the tuned-tank oscillator to a digital clock signal; and
   means for feeding the digital clock signal back to the oscillator to provide a self-regenerating clock recovery circuit.

5. The circuit of claim 4 further wherein said input includes a high speed CMOS integrated circuit buffer and wherein said digital clock signal is fed back to a circuit node at the output of said buffer.

6. The circuit of claim 5 further, wherein said oscillator includes a high impedance current source driving an L-C circuit, and wherein the output of said buffer is connected to drive said current source, and the L-C circuit produces said analog output signal.

7. The circuit of claim 6 further wherein said means for converting comprises a comparator.

* * * * *

UNITED STATES PATENT AND TRADEMARK OFFICE
CERTIFICATE OF CORRECTION

PATENT NO. : 5,047,735

DATED : September 10, 1991

INVENTOR(S) : Reuben W. Meline

It is certified that error appears in the above-identified patent and that said Letters Patent is hereby corrected as shown below:

In Column 2, line 13, after the word "common" insert thereto --.--.

In Column 2, line 52, before "1/2" insert thereto --^--.

Signed and Sealed this

Seventh Day of September, 1993

*Attest:*

BRUCE LEHMAN

*Attesting Officer*   *Commissioner of Patents and Trademarks*